United States Patent
Cammenga et al.

(10) Patent No.: US 11,719,868 B2
(45) Date of Patent: Aug. 8, 2023

(54) HAZE MATCHING IN A MASKED DISPLAY ASSEMBLY

(71) Applicant: GENTEX CORPORATION, Zeeland, MI (US)

(72) Inventors: David J. Cammenga, Zeeland, MI (US); Gary J. Dozeman, Zeeland, MI (US); Adam R. Heintzelman, Grand Rapids, MI (US)

(73) Assignee: GENTEX CORPORATION, Zeeland, MI (US)

( * ) Notice: Subject to any disclaimer, the term of this patent is extended or adjusted under 35 U.S.C. 154(b) by 242 days.

(21) Appl. No.: 17/142,290

(22) Filed: Jan. 6, 2021

(65) Prior Publication Data

US 2021/0208322 A1 Jul. 8, 2021

Related U.S. Application Data

(60) Provisional application No. 62/957,410, filed on Jan. 6, 2020.

(51) Int. Cl.
| | |
|---|---|
| *G02B 5/30* | (2006.01) |
| *G02B 5/20* | (2006.01) |
| *G02B 5/02* | (2006.01) |
| *H04N 23/57* | (2023.01) |

(52) U.S. Cl.
CPC .......... *G02B 5/3025* (2013.01); *G02B 5/0242* (2013.01); *G02B 5/0278* (2013.01); *G02B 5/205* (2013.01); *H04N 23/57* (2023.01)

(58) Field of Classification Search
CPC .................................................. G02B 5/3025
See application file for complete search history.

(56) References Cited

U.S. PATENT DOCUMENTS

| | | | | |
|---|---|---|---|---|
| 11,183,133 | B2* | 11/2021 | Lim | G02F 1/1335 |
| 2012/0106063 | A1* | 5/2012 | Mathew | G06F 1/1686 |
| | | | | 349/110 |
| 2017/0343715 | A1* | 11/2017 | Fang | G02B 27/28 |
| 2018/0067212 | A1 | 3/2018 | Wilson et al. | |
| 2020/0192146 | A1* | 6/2020 | Heintzelman | G02F 1/133528 |

FOREIGN PATENT DOCUMENTS

WO 1997023524 A1 7/1997

OTHER PUBLICATIONS

International Search Report dated Apr. 15, 2021, for corresponding PCT application No. PCT/US2021/012230, 3 pages.
Written Opinion dated Apr. 15, 2021, for corresponding PCT application No. PCT/US2021/012230, 6 pages.

* cited by examiner

*Primary Examiner* — Edmond C Lau
(74) *Attorney, Agent, or Firm* — Price Heneveld LLP; Brian James Brewer

(57) ABSTRACT

A system for reducing haze in a display comprises a first substrate having a first surface and a second surface; a masking layer disposed on the first surface of the first substrate; an optically clear adhesive; at least one of a display element and an imager; a first linear polarizer disposed between the display element and the optically clear adhesive; and a second linear polarizer. The masking layer comprises at least one opening in optical communication with at least one of the display element and the imager. The second linear polarizer may have a transmission angle generally aligned to the transmission angle of the first linear polarizer.

16 Claims, 4 Drawing Sheets

HAZE MATCHING IN A MASKED DISPLAY ASSEMBLY

CROSS REFERENCE TO RELATED APPLICATIONS

This application claims the benefit of and priority to U.S. Provisional Patent Application No. 62/957,410, filed on Jan. 6, 2020, entitled "Haze Matching In A Masked Display Assembly," the entire disclosure of which is hereby incorporated herein by reference.

FIELD OF THE DISCLOSURE

This disclosure relates generally to haze matching, and in particular, to haze matching in a masked display assembly.

BACKGROUND

It may be desirable to make a display assembly having a front substrate, a masking layer having one or more openings for a display element or imager, the display element or imager may be selectively viewable through front substrate, the one or more openings are essentially invisible when viewed from the front of the display assembly. However, in some cases, the material used for the masking layer may have a higher level of haze than the one or more openings, leading to differences in the haze levels between the masking layer and the openings therein, making the one or more openings visible. Furthermore, there may be a high contrast or apparent differences in reflection and color between the mask layer and the unmasked area over the one or more openings that may make the openings visible to a viewer. This difference in haze may be particularly noticeable with off angle light (a bright light where the reflection of the light is not lined up with the observer). The one or more openings may become more visible while the display element is in an off state. Particularly when viewed in bright light and off angle, the haze of the masking layer is clearly visible and contrasting to the less hazy area adjacent to the display element. If the display assembly in located outdoors, sunlight may cause the hazier area to look gray in comparison to the less hazy area. If the display area is less hazy than the masked area, the display area will look black in contrast to the gray masked area. Additionally, in applications where the front substrate of the device is curved, it is difficult to get uniform appearances in different light conditions and at different angles.

SUMMARY

According to one aspect, a device with reduced haze in a display may comprise a first substrate having a first surface and a second surface. A first adhesive may be disposed on the first surface and a first polarizer disposed on the first adhesive. The first adhesive may comprise an optically clear adhesive. Additionally, a masking layer may be disposed on the second surface, wherein the masking layer has at least one opening. Further, a display may be disposed adjacent the first substrate and optically aligned with the opening.

The first polarizer may be a linear polarizer. Additionally, the device may further comprise a second adhesive disposed on the first polarizer and a neutral density filter disposed on the second adhesive. Furthermore, the device may comprise a third adhesive disposed on the neutral density filter and a second substrate disposed on the third adhesive.

According to another aspect, a system for reducing haze in a display may comprise a first substrate having a first surface and a second surface; a masking layer disposed on the first surface of the first substrate; an optically clear adhesive having a refractive index; at least one of a display element and an imager; and a plurality of refracting beads having a refractive index and disposed within the optically clear adhesive; the masking layer may comprise at least one opening that allows the substrate to be in optical communication with the at least one of display element and imager; and the refractive index of at least some of the plurality of refracting beads may differ from the refractive index of the optically clear adhesive.

The first substrate may be transparent in the visible region of the electro-magnetic spectrum. The first substrate may be contoured to have a curvature. The system further may comprise a second substrate and a laminating layer. The second substrate may be disposed generally parallel to the first transparent substrate; and the laminating layer may be disposed adjacent to the second surface of the first substrate and between the first substrate and the second substrate. The second substrate may be transparent. The second substrate may be contoured to have a curvature corresponding to curvature of first substrate. The refracting beads may have an average length or diameter ranging between 2 and 10 microns. The refracting beads may comprise at least one of an acrylic material and a polymer and the optically clear adhesive may comprise at least one of a silicone, an acrylic, and a urethane. The refracting beads may comprise (%) by weight of the optically clear adhesive. The system further may comprise an anti-glare film disposed between the display element and the optically clear adhesive. The system further may comprise a linear polarizer disposed between the display element and the optically clear adhesive. The display assembly may be disposed in a surface of a pillar of a vehicle.

According to another aspect, a system for reducing haze in a display may comprise a first substrate having a first surface and a second surface; a masking layer disposed on the first surface of the first substrate; an optically clear adhesive; at least one of a display element and an imager; a first polarizer disposed between the display element and the optically clear adhesive; and a second polarizer. The masking layer may comprise at least one opening in optical communication with at least one of the display element and the imager. The first polarizer may be one of a linear polarizer and a circular polarizer. The second polarizer may be one of a linear polarizer and a circular polarizer. The first substrate may be transparent. The first substrate may be contoured to have a curvature along at least a portion of at least one of a length and a width of the first substrate. The masking layer may be disposed between the second polarizer and the display element. The masking layer may be disposed on the first surface of the first substrate; and the masking layer may extend over substantially all of the surface of the first substrate.

The first polarizer may be a linear polarizer having a transmission, and the second polarizer may be a linear polarizer and the second polarizer may have a transmission angle generally aligned to the transmission angle of the first polarizer. The system further may comprise a second substrate having a first surface disposed opposite the second surface of the first substrate, and a second surface, the second substrate disposed generally parallel to the first substrate, and a laminating layer disposed between the first surface of the second substrate and the second surface of the first substrate. The second substrate may be transparent. The first substrate may be contoured to have a curvature along at least a portion of at least one of a length and a width of the first substrate; and the second substrate may be contoured to have a curvature similar to curvature of first substrate. The system further may comprise an optical filter disposed between the first substrate and the second substrate. The optical filter may be a neutral density filter. The second polarizer may be disposed adjacent to or within the laminating layer. The second polarizer may extend over substantially all of a surface of one of the substrates. The first polarizer may be disposed on a surface of the display element between the display element and the optically clear adhesive. The first polarizer may be substantially smaller than the second polarizer. The system further may comprise an anti-glare coating disposed between the display element and the optically clear adhesive. The system further may comprise a plurality of refracting beads disposed in the optically clear adhesive. The refracting beads may have an average length or diameter ranging between 2 and 10 microns. The refracting beads may be less than one weight percent of the optically clear adhesive. The display assembly may be disposed in a surface of a pillar of a vehicle.

According to another aspect, a system for reducing haze in a display may comprise a first substrate having a first surface and a second surface; a masking layer disposed on the first surface of the first substrate; at least one of a display element and an imager; an optically clear adhesive disposed between the at least one of the display element and imager and the first substrate; and an optical filter disposed generally parallel to the first substrate. The first substrate may be transparent. The first substrate may be contoured to have a curvature along at least a portion of at least one of a length and a width of the first substrate. The system further may comprise a second substrate having a first surface and a second surface, and a laminating layer disposed between the first surface of the second substrate and the second surface of the first substrate; and the optical filter may be disposed between the first substrate and the second substrate. The optical filter may be a neutral density filter. The optical filter may be disposed between the linear polarizer and a user. The optical filter may be disposed in the laminating layer. The optical filter may be a film. The optical filter may be a coating and may be disposed on one of first and second surfaces of first substrate. The second substrate may have a curvature similar to curvature of first substrate.

The system further may comprise a first polarizer disposed between the display element and the optically clear adhesive. The first polarizer may be one of a linear polarizer and a circular polarizer. The system further may comprise a second polarizer, the second polarizer may be one of a linear polarizer and a circular polarizer. The second polarizer may be disposed on and extends over substantially all of the first surface of the first substrate. The first polarizer may comprise a linear polarizer having a transmission angle, and the second polarizer may comprise a linear polarizer; and the second polarizer may have a transmission angle generally aligned to the transmission angle of the first polarizer. The system further may comprise a plurality of refracting beads disposed in the optically clear adhesive. The refracting beads may have an average length or diameter ranging between 2 and 10 microns. The refracting beads may be less than one weight percent of the optically clear adhesive. The display assembly may be disposed in a surface of a pillar of a vehicle.

According to yet another aspect, a system for reducing haze in a display may comprise a first substrate having a first surface and a second surface; a masking layer disposed on the first surface of the first substrate; an optically clear adhesive; at least one of a display element and an imager; and at least one linear polarizer; the masking layer may comprise at least one opening in optical communication with at least one of the display element and the imager. The system further may comprise a second polarizer; and the second polarizer may be disposed on the second surface of the first substrate. The first substrate may be transparent. The first substrate may be contoured to have a curvature along at least a portion of at least one of a length and a width of the first substrate. The masking layer may be disposed between the second polarizer and the display element. The masking layer may be disposed on the first surface of the first substrate; and the masking layer may extend over substantially all of the surface of the first substrate.

The system further may comprise a second substrate having a first surface disposed opposite the second surface of the first substrate, and a second surface, the second substrate disposed generally parallel to the first substrate, and a laminating layer disposed between the first surface of the second substrate and the second surface of the first substrate. The second substrate may be transparent. The first substrate may be contoured to have a curvature along at least a portion of at least one of a length and a width of the first substrate; and the second substrate may be contoured to have a curvature similar to the curvature of first substrate. The linear polarizer may be disposed adjacent to or within the laminating layer. The system further may comprise an optical filter disposed between the first substrate and the second substrate. The optical filter may be a neutral density filter. The system further may comprise an anti-glare coating disposed between the display element and the optically clear adhesive. The system further may comprise a plurality of refracting beads disposed in the optically clear adhesive. The refracting beads may have an average length or diameter ranging between 2 and 10 microns. The refracting beads may be less than one weight percent of the optically clear adhesive. The display assembly may be disposed in a surface of a pillar of a vehicle.

According to another aspect, a system for reducing haze in a display may comprise a first substrate having a first surface and a second surface; a masking layer disposed on the first surface of the first substrate; at least one of a display element and an imager; an optically clear adhesive adhering the at least one of a display element and an imager to the first substrate; and a polarizer; wherein the masking layer may comprise at least one opening in optical communication with at least one of the display element and the imager; and wherein the masking layer may be disposed between the polarizer and the display element.

The polarizer may be one of a linear polarizer and a circular polarizer. The first substrate may be transparent. The first substrate may be contoured to have a curvature along at least a portion of at least one of a length and a width of the first substrate. The masking layer may be disposed between the second polarizer and the display element. The masking layer may be disposed on the first surface of the first substrate; and the masking layer may extend over substantially all of the surface of the first substrate. The system further may comprise a display polarizer disposed on a surface of the display element between the display element and the optically clear adhesive. The polarizer may be a linear polarizer and the display polarizer may be a linear polarizer; and the display polarizer may have a transmission angle generally aligned to the transmission angle of the polarizer. The polarizer may be a circular polarizer and the display polarizer may be a circular polarizer; and the display polarizer may polarize light in a first direction; and the polarizer may polarize light in a second direction opposite to the first direction. The system further may comprise a second substrate having a first surface disposed opposite the second surface of the first substrate, and a second surface, the second substrate disposed generally parallel to the first substrate, and a laminating layer disposed between the first surface of the second substrate and the second surface of the first substrate. The second substrate may be transparent. The first substrate may be contoured to have a curvature along at least a portion of at least one of a length and a width of the first substrate; and the second substrate may be contoured to have a curvature similar to the curvature of first substrate.

The system further may comprise an optical filter disposed between the first substrate and the second substrate. The optical filter may be a neutral density filter. The polarizer may be disposed adjacent to or within the laminating layer. The system further may comprise an anti-glare coating disposed between the display element and the optically clear adhesive. The system further may comprise a plurality of refracting beads disposed in the optically clear adhesive. The refracting beads may have an average length or diameter ranging between 2 and 10 microns. The refracting beads may be less than one weight percent of the optically clear adhesive. The display assembly may be disposed in a surface of a pillar of a vehicle.

BRIEF DESCRIPTION OF THE DRAWINGS

FIG. 3B illustrates a schematic cross-sectional side view of a second configuration of a third embodiment of a masked display assembly with haze reduction in accordance with this disclosure; and.

DETAILED DESCRIPTION

Figure 1:
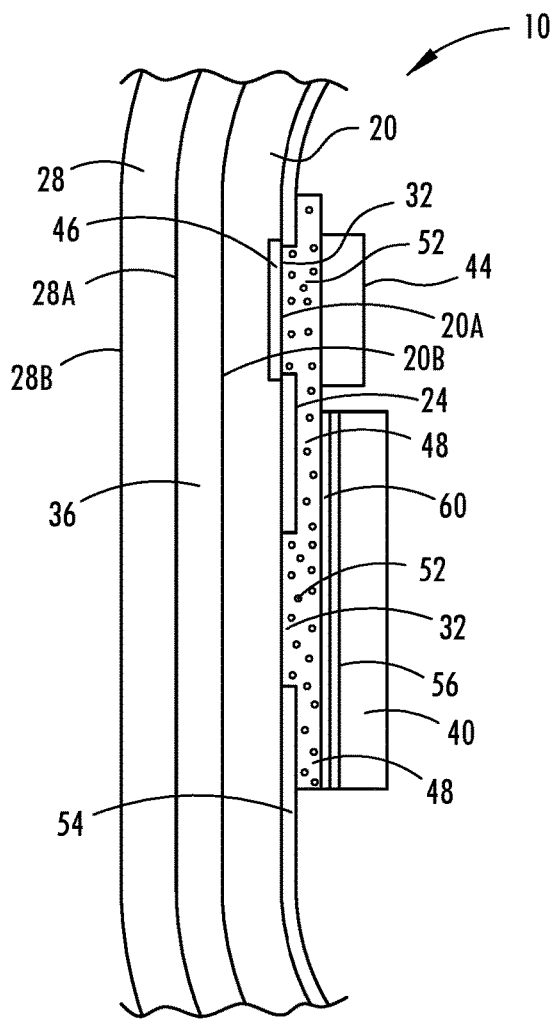
FIG. 1 illustrates a schematic cross-sectional side view of a first embodiment of a masked display assembly with haze reduction in accordance with this disclosure.

Referring to FIGS. 1-3B, a masked display assembly, generally shown at 10, may comprise a first substrate 20 having a first surface 20A and a second surface 20B. First substrate 20 may be a transparent in the visible region of the electromagnetic spectrum. In some embodiments, first substrate 20 may be contoured to have a curvature along at least a portion of the length and/or width of substrate. A masking layer 24 may be disposed on first surface 20A of first substrate 20. Masking layer 24 may comprise a film, an ink, paint, frit, or other appropriate material. Masking layer 24 or a portion of masking layer 24 may be an opaque material. Masking layer 24 may comprise at least one opening 32. It may be desirable to conceal the at least one opening 32. When comparing masked area 54 and area in proximity to the at least one opening 32, color matching, reflectivity matching and matching the light scattering of the at least one opening 32 may enable the concealment of the at least one opening 32.

In some embodiments, masked display assembly 10 may be associated with and/or disposed on a vehicle. For example, masked display assembly 10 may be disposed on an exterior surface of a B-pillar of a vehicle. Masked display assembly 10 may comprise a camera or imager 44 behind a first opening 32 in masking layer 24, a first display element 40 comprising at least one selectively illuminable icon behind a second opening 32, and a second display element 40 comprising a keyboard or other user interface behind a third opening 32. First display element 40 may comprise at least one light emitting diode. Second display element 40 may comprise a liquid crystal display.

First display element 40 may impart information to a user via images, icons, or text. The information may correspond to information useful to a user, such as whether the vehicle is locked, a security system status, an occupancy quantification, a diametric detection feedback, a current weather condition, a weather forecast, a battery charge status, a tire inflation status, a vehicle impact status, a vehicle identifier, or information identifying the driver for ride sharing platforms. Further, the information for display may be wirelessly retrieved in any number of manners. For example, display element 40 may be communicatively connected to a cellular network, satellite, or Wi-Fi network by which display element 40 may access the information via a cloud or other platform. Additionally, display element 40 may communicatively connect to a mobile device, such a as a smart phone, via a wireless connection such as Bluetooth or Wi-Fi direct when the mobile device is within range. Via the connection, display element 40 may retrieve information stored in an application on the mobile device or information at an internet location accessible via the mobile device's internet connection.

In some embodiments, masked display assembly 10 may further comprise a second substrate 28 having a first surface 28A and a second surface 28B and first surface of second substrate 28 may be opposed to second surface 20B of first substrate 20. Second substrate 28 may be contoured to conform with the contour of first substrate 20. Second substrate 28 may be disposed generally parallel to the first substrate 20. Second substrate 28 may be transparent in the visible region of the electromagnetic spectrum. A laminating layer 36 may extend between first and second substrates 20, 28. Laminating layer 36 may be disposed adjacent to second surface 20B of first substrate 20. Laminating layer 36 may be capable of adhering first substrate 20 to second substrate 28. In some embodiments, laminating layer 36 may comprise an optically clear adhesive.

In some embodiments, at least one display element 40 may be disposed to cover the at least one opening 32 in masking layer 24. The at least one display element 40 may extend beyond the perimeter of the at least one opening 32. The at least one display element 40 may be aligned with at least one opening 32 in masking layer 24 to be in selective optical communication with first substrate 20. The at least one display element 40 may capable of selectively being seen through the at least one opening 32. The at least one display element ay comprise a liquid crystal display, one or more light emitting diodes, one or more organic light emitting diodes, or other suitable displays.

In some embodiments, a camera or other imager 44 may be aligned with one of the at least one openings 32 in masking layer 24, and may be in selective optical communication with first substrate 20. An electro-optic element 46 may be disposed between imager 44 and first substrate 20. Electro-optic element 46 may be configured to selectively darken to conceal imager 44.

An optically clear adhesive 48 may be disposed between display element 40 and masking layer 24, optically bonding display element 40 to masking layer 24. Masking layer 24 may be disposed between first substrate 20 and display element 40. Optically clear adhesive 48 may be in contact with masking layer 24, first surface of second substrate 28, and display assembly. For the case in which the level of haze in masked area 54 is higher than the level of haze in the opening, contrast in haze may be reduced or eliminated in masked display assembly 10 by incorporating a plurality of refracting beads 52 in optically clear adhesive 48 as shown in FIG. 1. Masked area 54 is a region defined by masking layer 24. Refracting beads 52 may have a refractive index different from the refractive index of optically clear adhesive 48. The refractive index of refracting beads 52 may be either higher or lower than the refractive index of optically clear adhesive 48. The difference between the refractive index of refracting beads 52 and the refractive index of optically clear adhesive 48 may cause light scattering, thereby increasing the haze in the area of the at least one opening 32 and reducing the contrast between the portions of first and/or second substrates 20, 28 adjacent to masked portions of masking layer 24 and portions of first and/or second substrates 20, 28 adjacent to at least one opening 32 in masking layer 24. As the refractive index of refracting beads 52 approaches the refractive index of optically clear adhesive 48, the inclusion of an increasing number of refracting beads 52 may be needed to achieve satisfactory light scattering results.

By way of explanation and not limitation, refracting beads 52 may be irregular in shape, or they may have a substantially round or spherical orientation. Refracting beads 52 may have an average length or diameter of less than 10 microns and the average length or diameter may be between 2 and 10 microns. At this size, refracting beads 52 cannot be seen by a viewer of masked display assembly 10 but are sufficiently large to scatter light. Selection of properly sized refracting beads 52 can be accomplished by sieving refracting beads 52 through successive screens of progressively smaller aperture sizes to obtain a desired size or range of sizes.

Refracting beads 52 may be formed of glasses, polymers, ceramics, organics, inorganics, salts and other suitable non-conductive materials, or combinations thereof that provide refracting beads 52 with a suitable refractive index. For example, refracting beads 52 may be substantially composed of an acrylic material such as polymethyl methacrylate or of a polymer such as polystyrene. In some embodiments, a plurality of different refracting beads 52 may be used. Refracting beads 52 may be present in similar or different proportions.

Optically clear adhesive 48 may comprise, for example, acrylic, silicon, or urethane adhesives. Acrylic refracting beads 52 may be used with a non-acrylic optical bonding film, such as a urethane, to ensure that the respective refractive indices of refracting beads 52 and optically clear adhesive 48 differ sufficiently to allow the scattering of light from point light sources. Non-acrylic refracting beads 52 may be used with an acrylic optical bonding film, or a non-acrylic optical bonding film such as a urethane optical bonding film.

Some embodiments may have less than five weight percent refracting beads 52, less than two weight percent refracting beads 52, less than or equal to about one weight percent refracting beads 52, and about 0.5 weight percent refracting beads 52. The weight-percent indicates the total weight of refracting beads 52 as a percentage of the sum of the weight of optically clear adhesive 48 and refracting beads 52.

In some embodiments, masked display assembly 10 may further include one or more polarizers. For example, masked display assembly 10 may include a first polarizer 56. First polarizer 56 may comprise a linear polarizer or a circular polarizer. Masked display assembly 10 may further include a second polarizer 64. Second polarizer 64 may comprise a linear polarizer or a circular polarizer.

Masked display assembly 10 may be configured with the first polarizer 56 disposed between two layers or disposed on display element 40. As shown in the figures, first polarizer 56 is disposed between display element 40 and optically clear adhesive 48 or between display element 40 and an anti-glare film 60. However, first polarizer 56 may alternatively be disposed between other layers. For example, first polarizer 56 may be disposed between anti-glare film 60 and optically clear adhesive 48 or on the exposed surface of display element 40.

Similarly, second polarizer 64 may be disposed between first substrate 20 and second substrate 28. Specifically, second polarizer 64 may be disposed between first substrate 20 and laminating layer 36, between laminating layer 36 and second substrate 28, between an optical filter 68 and first substrate 20, or in other positions between first and second substrates 20, 28.

In some embodiments, masked display assembly 10 may include an optically clear adhesive 48 disposed on second surface 20B of first substrate 20. First polarizer 56 may be disposed on optically clear adhesive 48. Additionally, masking layer 24 may be disposed on first surface 20A of first substrate 20. Masking layer 24 may comprise at least one opening 32. Display element 40 may be disposed adjacent first substrate 20 and optically aligned with one of the at least one openings 32. In some embodiments, optically clear adhesive 48 may further be disposed on first polarizer 56, thereby adhering optical filter 68 to first polarizer 56. In some embodiments, a second substrate 28 may be adhered to optical filter 68 via optically clear adhesive 48 being disposed therebetween.

In some embodiments, masked display assembly 10 may further include a first polarizer 56. First polarizer 56 may be disposed on a surface of display element 40 between display element 40 and optically clear adhesive 48. First polarizer 56 may be generally coextensive with the surface of display element on which it is located. In some embodiments, first polarizer 56 may be disposed between masking layer 24 and first surface 20A of first substrate 20. Display element 40 may be configured to selectively emit light, and light may travel through first polarizer 56 and through at least one opening 32 in masking layer 24. Display element 40 may comprise a light source (not shown). Light source may comprise a liquid crystal display (LCD) such as a light emitting diode (LED), an organic LED (OLED), or the like.

In some embodiments, masked display assembly 10 may comprise an anti-glare film 60. Anti-glare films are typically slightly hazy and may help to increase the haze in the area adjacent to display element 40 to better match the haze of masked area 54. Anti-glare film 60 may be disposed between display element 40 and optically clear adhesive 48.

Figure 2A:
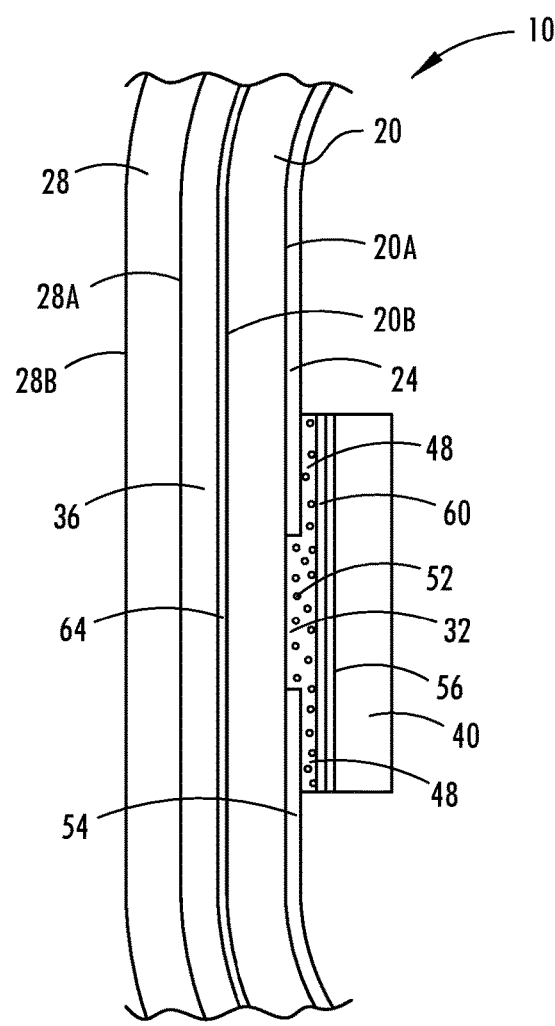
FIG. 2A illustrates a schematic cross-sectional side view of a first configuration of a second embodiment of a masked display assembly with haze reduction in accordance with this disclosure.

In some embodiments, masked display assembly 10 may comprise a first substrate 20, masking layer 24 disposed on a first surface 20A of first substrate 20 and having at least one opening 32, at least one of display element 40 and imager 44 aligned with and in optical communication with at least one opening 32 of masking layer 24, an optically clear adhesive 48 extending between masking layer 24 and at least one of the display element 40 and the imager 44, first polarizer 56 disposed between display element 40 and optically clear adhesive 48, and a second polarizer 64 as shown in FIG. 2A. First polarizer 56 may comprise a linear polarizer or a circular polarizer. First substrate 20 may be contoured to have a curvature in at least one direction. First substrate 20 may be transparent. Masking layer 24 may be disposed between second polarizer 64 and display element 40. In some embodiments, second polarizer 64 may replace first polarizer 56, and masked display assembly 10 may have only a single polarizer 64, the polarizer 64 disposed on first surface 20A of first substrate 20. In some embodiments, second polarizer 64 may comprise a linear polarizer and display element 40 may comprise a liquid crystal display.

In some embodiments, second polarizer 64 may comprise a circular polarizer and display element 40 may comprise an organic light emitting diode (OLED). Circular polarizer 64 may be particularly effective at reducing the haze from the masking layer and also reducing reflectance from the OLED. Using a circular polarizer 64 may eliminate most of the haze since the light that enters into masked display assembly 10 from the front side of masked display assembly 10 is circularly polarized with one handedness. The reflected light including the haze from masking layer 24 will flip handedness and will be blocked by the circular polarizer as it comes back toward the front of the assembly. Since most OLED displays comprise a circular polarizer, adding this polarizer to the display assembly is a way of eliminating most haze without reducing the amount of emitted display light.

Masked display assembly 10 may further comprise second substrate 28. Second substrate 28 may be transparent. Second substrate 28 may be contoured to have a curvature that corresponds with the curvature of first substrate 20. Second substrate 28 may be disposed generally parallel to first substrate 20. Laminating layer 36 may extend between first substrate 20 and second substrate 28, adhering them together. First polarizer 56 may be smaller than second polarizer 64. Second polarizer 64 may extend over substantially the entire first surface 20A of first substrate 20.

Second polarizer 64 may comprise a linear polarizer and may have a transmission angle generally aligned to the transmission angle of first polarizer 56 to reduce haze while not significantly diminishing the light output from display element 40. In some embodiments, second polarizer 64 may be disposed within laminating layer 36 between first and second substrates 20, 28. In some embodiments, second polarizer 64 may be disposed adjacent to laminating layer 36, either between laminating layer 36 and first substrate 20 or between laminating layer 36 and second substrate 28.

Figure 2B:
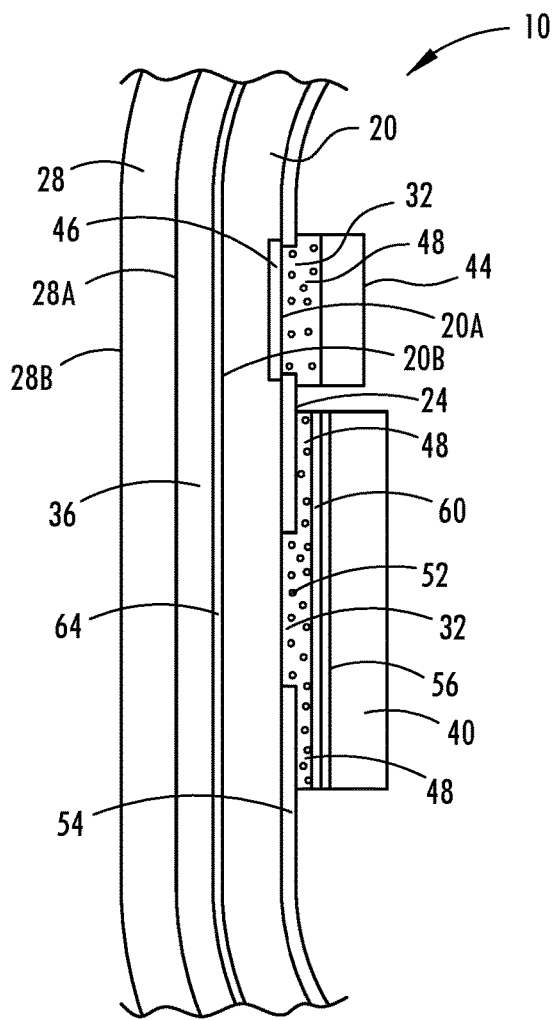
FIG. 2B illustrates a schematic cross-sectional side view of a second configuration of a second embodiment of a masked display assembly with haze reduction in accordance with this disclosure.

In some embodiments, masked display assembly 10 may further comprise a plurality of refracting beads 52 disposed in optically clear adhesive 48 as shown in FIG. 2B. Refracting beads 52 may have a refractive index different from the refractive index of optically clear adhesive 48, thereby causing the increase in haze in proximity to optically clear adhesive 48. The concentration of refracting beads 52 in optically clear adhesive 48 may be adjusted until the levels of haze in masked area 54 and the at least one opening 32 are nearly the same. Matching the level of haze provides reduction of the appearance of contrasts in the haze in masked display assembly 10.

Figure 2C:
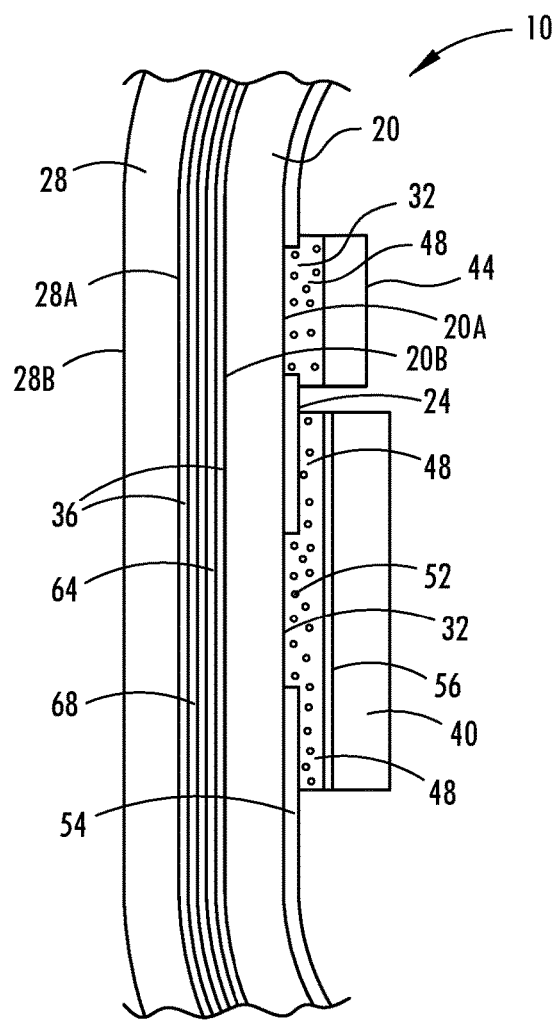
FIG. 2C illustrates a schematic cross-sectional side view of an example of the first configuration of the second embodiment of a masked display assembly with haze reduction in accordance with this disclosure.

In some embodiments, second polarizer 64 may function to reduce glare to camera 44 or display element 40 positioned behind masking layer 24. For example, masked display assembly 10 may be disposed in a B-Pillar assembly of a vehicle. First polarizer 56 may be disposed between masking layer 24 and first surface 20A of first substrate 20, thereby polarizing light emitted from display element 40 to be oriented to be generally vertical in relationship to the vehicle. first polarizer 56 may be generally coextensive with display element 40. Camera or imager 44 may be disposed behind an opening 32 in masking layer 24. A second polarizer 64 may be disposed between first and second substrates 20, 28. In use, second polarizer 64 may be configured to have light transmission that is generally vertical in relation to the vehicle and have a transmission angle generally aligned to the transmission angle of the polarization of first polarizer 56. In this example, first and second substrates 20, 28 may comprise glass, and second polarizer 64 may be disposed between two layers of ethylene vinyl acetate (EVA) or polyvinyl butyral (PVB) that comprise laminating layer 36, as shown in FIG. 2C. The EVA or PVB layers may laminate first and second substrates 20, 28 together. Second polarizer 64 may extend across substantially the entire second surface 20B, 28B of one of first and second substrates 20, 28. Second polarizer 64 may reduce glare to imager 44. For outdoor applications, polarizer 64 may be positioned to have a vertical transmission angle, thereby minimizing glare from horizontal surfaces. Since second polarizer 64 may have a transmission angle generally aligned to the transmission angle of first polarizer 56, it may allow most of the light from display element 40 to pass through. In one embodiment, first polarizer 56 may be eliminated and second polarizer 64 may serve as the sole polarizer for display element 40. In this case, second polarizer 64 may comprise a linear polarizer.

In the example above, without second polarizer 64, the amount of haze in masked area 54 is approximately 0.8% and the haze in the area adjacent to display element 40 is approximately 0.1%. When second polarizer 64 is added the measured haze in masked area 54 is approximately 0.3% and the haze in the area adjacent to display element 40 is approximately 0.03%.

In some embodiments, masked display assembly 10 may further comprise anti-glare film 60. Anti-glare film 60 may be slightly hazy to increase the haze in masked display assembly 10 in the region of the at least one opening 32 in masking layer 24. Anti-glare film 60 may be disposed between display element 40 and optically clear adhesive 48.

Figure 3A:
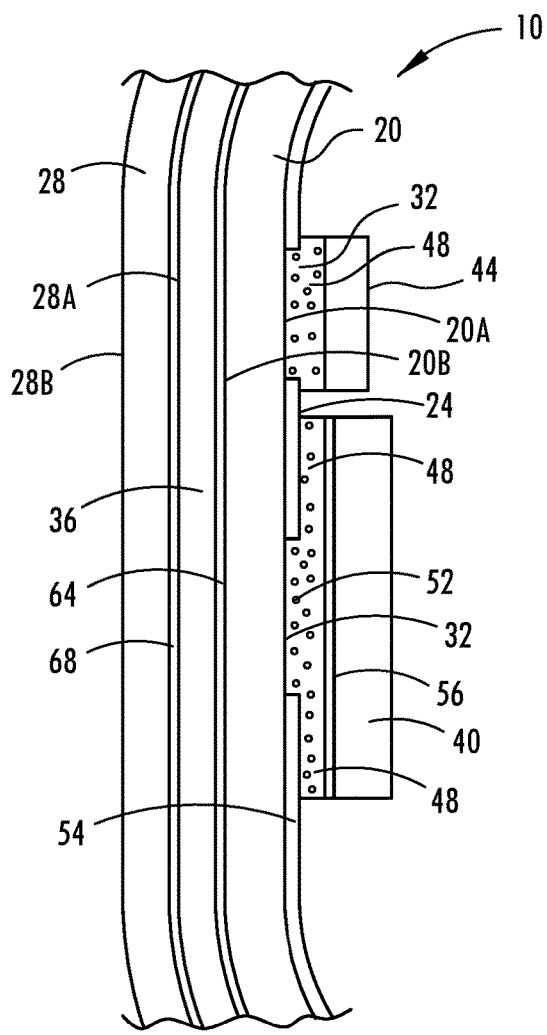
FIG. 3A illustrates a schematic cross-sectional side view of a first configuration of a third embodiment of a masked display assembly with haze reduction in accordance with this disclosure.

In some embodiments, masked display assembly 10 for matching the appearance of haze in an area adjacent to display element 40 may comprise a first substrate 20, second substrate 28 generally parallel to first substrate 20, masking layer 24 having at least one opening 32 and disposed on first surface 20A of first substrate 20, at least one of a display element 40 and imager 44 in optical communication with first substrate 20 through the at least one opening 32 in masking layer 24, an optically clear adhesive 48 adhering the at least one of a display element 40 and imager 44 to masking layer 24, and optical filter 68 disposed generally parallel to first substrate 20 as shown in FIG. 3A. In some embodiments, optical filter 68 may comprise a film. In some embodiments, optical filter 68 may comprise a coating, and may be disposed on one of first surface 20A and second surface 20B of first substrate 20.

Optical filter 68 may be a neutral density filter that absorbs light of all wavelengths to the same extent, causing overall dimming but no change in color. Optical filter 68 is shown disposed between second polarizer 64 and second surface 28B of second substrate 28 but could alternatively be disposed within laminating layer 36 or between laminating layer 36 and first substrate 20 and still remain within the contemplated scope of this disclosure. When disposed in lamination layer, a neutral density optical filter 68 may reduce the level of haze from the masking layer and from the display layer. For example, a 50% transmissive neutral density filter 68 may be place between first and second substrates 20, 28 to reduce the amount of light scattering from masked area 54 and the area within the at least one opening 32. The 50% neutral density filter 68 will reduce the brightness coming from display element 40 by approximately 50%. In comparison, a linear polarizer disposed within laminating layer 36 may reduce the non-polarized light coming from the side of the viewer by over 50%, but polarized light coming from display element 40 may be transmitted without significant absorption. Thus, disposing polarizer within lamination layer 36 may reduce the haze by over 50% while transmitting most of the light emitted from display element 40. Neutral density filter 68 may reduce both haze and the display light by approximately the same percentage. Combining the neutral density filter and the second linear polarizer will reduce the haze by approximately 75% or more. Reducing the level of haze in both the masked areas and in the masked openings may reduce the overall contrast between the two areas.

First substrate 20 and second substrate 28 may both be contoured to have a curvature, and the curvature of first substrate 20 may correspond with curvature of second substrate 28. First substrate 20 and second substrate 28 may be transparent. Laminating layer 36 may be disposed between first and second substrates 20, 28, securing them one to another. Optical filter 68 may be disposed between first and second substrates 20, 28. Optical filter 68 may be disposed within the laminating layer 36 or adjacent to laminating layer 36. In some embodiments, optical filter 68 may be a film. In some embodiments, optical filter 68 may be a coating and may be disposed on one of first and second surfaces 20A, 20B of first substrate 20.

Figure 3B:
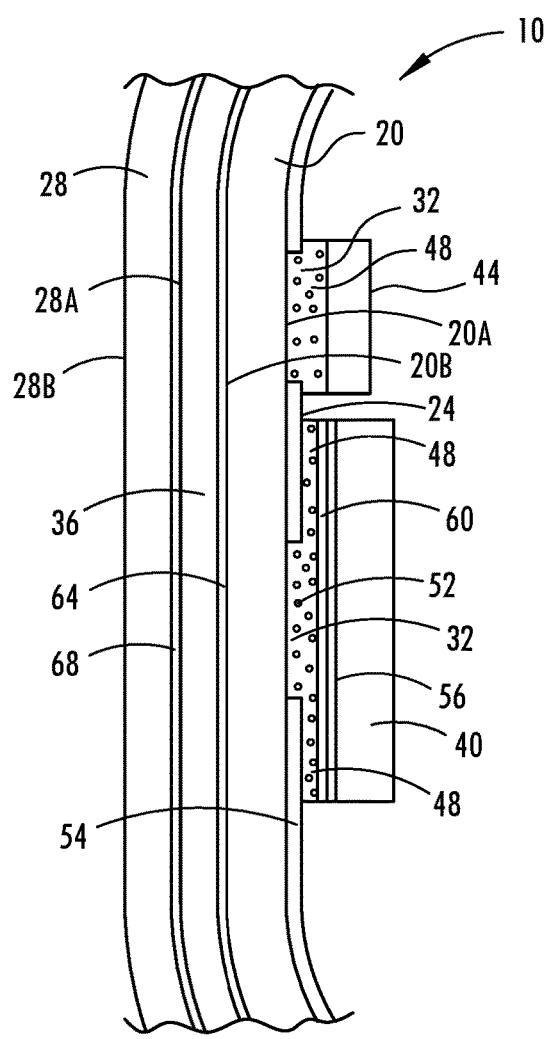

In some embodiments, masked display assembly 10 may further comprise a first polarizer 56 disposed between masked layer and a first surface 20A of first substrate 20. First polarizer 56 may comprise a linear polarizer or a circular polarizer. In some embodiments, masked display assembly 10 may further comprise a second polarizer 64 disposed adjacent to or within laminating layer 36 as illustrated in FIG. 3B. Second polarizer 64 is shown disposed adjacent to laminating layer 36 between laminating layer 36 and first substrate 20, but second polarizer 64 may alternatively be disposed within laminating layer 36 or between laminating layer 36 and second substrate 28 and still be within the contemplated scope of this disclosure. Second polarizer 64 may have a transmission angle generally aligned to the transmission angle of first polarizer, thereby allowing most of light from display element 40 to pass through first and second substrates 20, 28.

In some embodiments, masked display assembly 10 may further comprise a plurality of refracting beads 52 as shown in FIG. 3B. Refracting beads 52 may be disposed in optically clear adhesive 48. Refracting beads 52 may have a refractive index different from the refractive index of optically clear adhesive 48, and this may cause the reduction of the appearance of haze in masked display assembly 10.

In some embodiments, masked display assembly 10 for reducing haze in a display may be disposed in a surface of a pillar of a vehicle. Masked display assembly 10 may comprise first substrate 20 having first surface 20A and second surface 20B; masking layer 24 disposed on first surface 20A of first substrate 20; at least one of a display element 40 and an imager 44; an optically clear adhesive 48 adhering the at least one of a display element and an imager 44 to first substrate 20; and a polarizer 64. First substrate 20 may be transparent. First substrate 20 may be contoured to have a curvature along at least a portion of at least one of a length and a width of first substrate 20.

Masking layer may be disposed between second polarizer and display element. Masking layer may be disposed on first surface 20A of first substrate 20; and masking layer may extend over substantially all of the surface of first substrate 20. Masking layer 24 may comprise at least one opening 32 in optical communication with at least one of the display element 40 and imager 44. Masking layer 24 may be disposed between polarizer 64 and display element 40.

Polarizer 64 may be one of a linear polarizer and a circular polarizer. Masked display assembly 10 further may comprise display polarizer 56 disposed on a surface of display element 40 between display element 40 and optically clear adhesive 48. In some embodiments, both polarizer 64 and display polarizer may be linear polarizers. Display polarizer may have a transmission angle generally aligned to the transmission angle of polarizer. In some embodiments, polarizer may be a circular polarizer and display polarizer may be a circular polarizer. Display polarizer may polarize light in a first direction and polarizer may polarize light in a second direction opposite to the first direction.

Masked display assembly 10 further may comprise a second substrate 28 having a first surface 28A disposed opposite second surface of first substrate 20, and a second surface, the second substrate 28 disposed generally parallel to first substrate 20, and laminating layer 36 disposed between first surface 28A of second substrate 28 and second surface of first substrate 20. Second substrate 28 may be transparent. First substrate 20 may be contoured to have a curvature along at least a portion of at least one of a length and a width of first substrate 20; and second substrate 28 may be contoured to have a curvature similar to curvature of first substrate 20. Polarizer may be disposed between first and second substrates 20, 28, either adjacent to or within laminating layer 36.

Optical filter 68 may be disposed between first substrate 20 and second substrate 28. Optical filter may be a neutral density filter. Anti-glare coating 60 may be disposed between display element 40 and optically clear adhesive 48. Masked display assembly 10 further may comprise a plurality of refracting beads disposed in optically clear adhesive. Refracting beads may have an average length or diameter ranging between 2 and 10 microns. Refracting beads may be less than one weight percent of optically clear adhesive.

Figure 4:
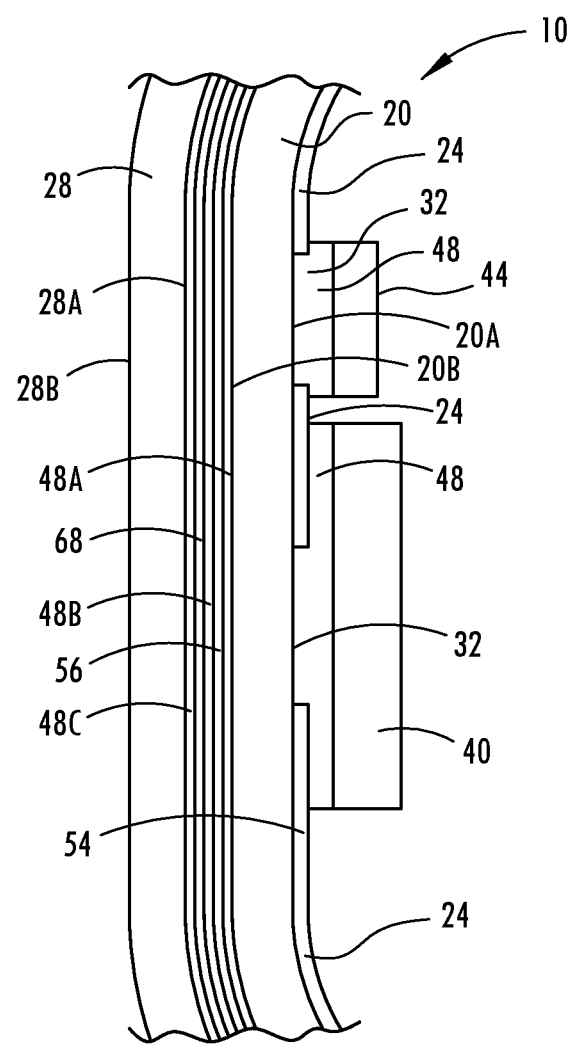
FIG. 4 illustrates a schematic cross-sectional side view of an embodiment of a masked display assembly in accordance with this disclosure.

In some embodiments, as shown in FIG. 4, masked display assembly 10 may comprise a first substrate 20 having a first surface 20A and a second surface 20B. First adhesive layer 48A may be disposed on first surface 20A and first polarizer 56 disposed on first adhesive layer 48A. First polarizer 56 may be a linear polarizer. First adhesive layer 48A may comprise an optically clear adhesive. Masking layer 24 may be disposed on second surface 20B. Masking layer 24 may have at least one opening 32. Display element 40 may be disposed adjacent first substrate 20 and optically aligned with the opening. Additionally, or alternatively, camera or imager 44 may be disposed adjacent first substrate 20 and optically aligned with opening 32.

Additionally, the device may further comprise a second adhesive layer 48B disposed on first polarizer 56 and neutral density filter 68 disposed on second adhesive layer 48B. Masked display assembly 10 may further comprise a third adhesive layer 48C disposed on neutral density filter 68. Second substrate 28 may be disposed on third adhesive layer 48C.

The above description is considered that of the preferred embodiments only. Modifications of the disclosure will occur to those skilled in the art and to those who make or use the disclosure. Therefore, it is understood that the embodiments shown in the drawings and described above are merely for illustrative purposes and not intended to limit the scope of the disclosure, which is defined by the following claims as interpreted according to the principles of patent law, including the doctrine of equivalents.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element. These terms are not meant to limit the element which they describe, as the various elements may be oriented differently in various applications.

The invention claimed is:

1. A system for reducing haze in a display, comprising:
   a first substrate having a first surface and a second surface;
   a masking layer disposed on the first surface of the first substrate;
   an optically clear adhesive;
   at least one of a display element and an imager;
   a first polarizer disposed between the display element and the optically clear adhesive; and
   a second polarizer;
   a second substrate having a first surface disposed opposite the second surface of the first substrate, the second substrate disposed generally parallel to the first substrate;
   a laminating layer disposed between the first surface of the second substrate and the second surface of the first substrate;
   wherein the second polarizer is disposed adjacent to or within the laminating layer;
   wherein the masking layer comprises at least one opening in optical communication with at least one of the display element and the imager.

2. The system of claim 1, wherein the first polarizer is a linear polarizer having an angle of transmission;
   wherein the second polarizer is a linear polarizer; and
   wherein the second polarizer has a transmission angle generally aligned to the transmission angle of the first linear polarizer.

3. The system of claim 1, wherein the masking layer is disposed on the first surface of the first substrate.

4. The system of claim 1, further comprising a neutral density optical filter disposed between the first substrate and the second substrate.

5. The system of claim 2, wherein the first linear polarizer is disposed on a surface of the display element between the display element and the optically clear adhesive.

6. The system of claim 1, further comprising a second adhesive disposed on the first polarizer.

7. The device of claim 1, wherein the first polarizer is a linear polarizer.

8. The device of claim 1, further comprising a neutral density filter disposed on the second adhesive.

9. The device of claim 8, wherein the second adhesive is an optically clear adhesive.

10. The system of claim 1, wherein the display element is disposed adjacent the first substrate, the display element optically aligned with the opening.

11. The device of claim 8, further comprising:
    a third adhesive disposed on the neutral density filter; and
    wherein the second substrate disposed on the third adhesive.

12. The device of claim 11, wherein the third adhesive is an optically clear adhesive.

13. A system for reducing haze in a display, comprising:
    a first substrate having a first surface and a second surface;
    a second substrate having a first surface disposed opposite the second surface of the first substrate, and a second surface, the second substrate disposed generally parallel to the first substrate;
    a laminating layer disposed between the first surface of the second substrate and the second surface of the first substrate;
    a masking layer disposed on the first surface of the first substrate;
    an optically clear adhesive;
    at least one of a display element and an imager; and
    at least one linear polarizer;
    wherein the linear polarizer is disposed adjacent to or within the laminating layer;
    wherein the masking layer comprises at least one opening in optical communication with at least one of the display element and the imager.

14. The system of claim 13, further comprising a second polarizer; wherein the second polarizer is disposed on the second surface of the first substrate.

15. The system of claim 13, further comprising an optical filter disposed between the first substrate and the second substrate.

16. The system of claim 13, wherein the first substrate is contoured to have a curvature along at least a portion of at least one of a length and a width of the first substrate; and
    wherein the second substrate is contoured to have a curvature similar to curvature of first substrate.

* * * * *